(12) United States Patent
Spuller et al.

(10) Patent No.: US 11,817,297 B2
(45) Date of Patent: Nov. 14, 2023

(54) SYSTEM AND METHOD FOR MANAGING SUBSTRATE OUTGASSING

(71) Applicant: Applied Materials, Inc., Santa Clara, CA (US)

(72) Inventors: Matthew Spuller, Belmont, CA (US); Dongming Iu, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 574 days.

(21) Appl. No.: 16/812,144

(22) Filed: Mar. 6, 2020

(65) Prior Publication Data

US 2021/0280391 A1  Sep. 9, 2021

(51) Int. Cl.
*H01L 21/66* (2006.01)
*H01J 37/32* (2006.01)
*C23C 16/455* (2006.01)
*H01L 21/67* (2006.01)
*C23C 16/46* (2006.01)

(52) U.S. Cl.
CPC .. *H01J 37/32449* (2013.01); *C23C 16/45557* (2013.01); *C23C 16/466* (2013.01); *H01L 21/67248* (2013.01); *H01L 21/67253* (2013.01); *H01L 22/12* (2013.01)

(58) Field of Classification Search
CPC ......... H01J 37/32449; C23C 16/45557; C23C 16/466; H01L 21/67248; H01L 21/67253; H01L 22/12
See application file for complete search history.

(56) References Cited

U.S. PATENT DOCUMENTS

| 7,024,950 B2 | 4/2006 | Guldi et al. | |
| 2006/0021633 A1* | 2/2006 | Harvey | B08B 7/0035 134/1.1 |
| 2015/0200110 A1* | 7/2015 | Li | H01L 21/31144 438/696 |
| 2017/0294292 A1 | 10/2017 | Hawrylchak et al. | |

(Continued)

FOREIGN PATENT DOCUMENTS

| JP | 11335812 A | 12/1999 |
| JP | 2003209103 A | 7/2003 |

(Continued)

OTHER PUBLICATIONS

International Search Report/Written Opinion issued to PCT/US2020/064787 dated Apr. 15, 2021.

(Continued)

*Primary Examiner* — Mohammad M Choudhry
(74) *Attorney, Agent, or Firm* — Applied Materials, Inc.; Chad M. Dougherty (57) ABSTRACT

Embodiments of the present disclosure relate to apparatus, systems and methods for managing organic compounds in thermal processing chambers. A gas line can be in fluid communication with the thermal processing chamber and an exhaust pump can be coupled to the thermal processing chamber by an exhaust conduit and controlled by an effluent flow control valve. The apparatus includes a sampling line with an organic compound sensor coupled to the exhaust conduit. The organic compound sensor can be in communication with a control module which can control operating parameters for processing a substrate.

20 Claims, 5 Drawing Sheets

(56) References Cited

U.S. PATENT DOCUMENTS

2018/0252669 A1\* 9/2018 Oh .................. G01N 33/004
2019/0157124 A1 5/2019 Hsieh et al.

FOREIGN PATENT DOCUMENTS

| JP | 2004-014555 A | 1/2004 |
| JP | 2008-210852 A | 9/2008 |
| JP | 2010-087475 A | 4/2010 |
| JP | 2011-523774 A | 8/2011 |
| KR | 200456733 Y1 | 11/2011 |

OTHER PUBLICATIONS

Japanese Office Action for Application No. 2022-524939 dated Jun. 20, 2023.

\* cited by examiner

SYSTEM AND METHOD FOR MANAGING SUBSTRATE OUTGASSING

BACKGROUND

Field

Embodiments of the present disclosure generally relate to systems and methods of manufacturing a semiconductor device. More particularly, the present disclosure is directed to systems and methods for managing substrate outgassing.

Description of the Related Art

In certain thermal processes, materials may be outgassed from substrates being thermally processed. Generally, the outgassed materials are exhausted from the processing volume of a thermal processing chamber periodically. However, the outgassed materials can deposit on the substrates which may lead to failure of microelectronic devices ultimately formed on the substrate. Preventing failures typically relies on end-of-line device performance and yield to make determinations or adjustments of outgassing frequency for future runs. Relying on end-of-line performance does not provide information on adjusting operating parameters during production in order to process optimally. Thus, there is a need for systems and methods for managing substrate outgassing during production.

SUMMARY

In an embodiment, a substrate processing apparatus is provided that includes a thermal processing chamber defining a processing volume, a gas line coupled to the thermal processing chamber, an exhaust coupled to the thermal processing chamber by an exhaust conduit, an exhaust flow controller coupled to the exhaust conduit, and a sampling line coupled to the exhaust conduit. The sampling line includes an organic compound sensor and a sampling flow control valve. The organic compound sensor can be in communication with a control module.

In another embodiment, a method of processing a substrate is provided that includes processing a substrate in a thermal processing chamber using operating parameters. Sensor data can be collected from a sensor reading of an effluent of the thermal processing chamber using an organic compound sensor. At least one property of the effluent can be determined based on the sensor data.

In another embodiment, an algorithm stored in a memory of a system is provided that includes a number of instructions which, when executed by a processor, causes a method to be performed, including processing a substrate in a thermal processing chamber using operating parameters, generating sensor data from a sensor reading of an effluent of the thermal processing chamber using an organic compound sensor, and determining at least one property of the effluent based on the sensor data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Thermal processing of semiconductor substrates is commonly employed in semiconductor manufacturing for a variety of purposes. Different types of thermal processing can include rapid thermal processing, laser processing, and soak annealing. Temperatures employed during thermal processing may alter various properties of the substrates and materials disposed thereon. For example, dopant diffusion, crystallographic material modification, and surface modification are just some of the types of processes that may be achieved by thermal processing.

Conventional approaches for monitoring device defects that result from thermal processing of substrates typically rely on end-of-line device performance and yield. Higher levels of defectivity may be detectable with particle measurement on substrate metrology. Detecting the level of defects at the end of processing does not allow for in-process adjustments to be made to mitigate defects on the substrate and subsequent substrates. In contrast to such conventional approaches, the inventors have found that use of a sensor integrated to the chamber provides real-time feedback of organic compound outgassing during thermal processing without using end-of-line defectivity measurements. Moreover, the use of such real-time feedback from the sensor can enable process design and control. In particular, a process design includes operating parameters for each stage in the process and each of these operating parameters can be adjusted based on properties that are determined using a number of different methods. The operating parameters include one or more of gas type, gas flow rate, time, pressure, temperature, plasma on or plasma off, ramp rates, position of the substrate, among others. The inventors have further found that the sensor enables operation of thermal processing chambers, such as anneal chambers, with high throughput, low defectivity, and high reproducibility. In some embodiments, operating parameters are adjusted based on the sensor reading by adjusting operating parameters until a sample reading is below a predetermined sensor reading for a property.

In one example which can be combined with other examples, the sensor samples exhaust from the chamber using an inlet sampling line. In at least one embodiment, which can be combined with other embodiments, the sensor is contained within a housing with power and electrical connections that send signals, or sensor data to a control module. In these and other embodiments, the signal is processed and used by the system to enable control of various operating parameters and process. The signal can also be collected and used to develop information that can be used post processing to better understand operating parameters. Although the sensor data is evaluated after the process, the sensor data is more complete than end-of-line defectivity measurements because the sensor data provides insight over the process as a whole to improve upon future processing. In contrast, end-of-line defectivity measurements merely provide information on the presence of defects on the final device.

Certain aspects of the present disclosure provide systems and methods for managing substrate outgassing during thermal processing. In some embodiments, apparatus described herein include a thermal processing chamber defining a processing volume having a gas line coupled to the thermal processing chamber to deliver a gas to the processing volume. The thermal processing chamber also includes an exhaust coupled to the thermal processing chamber by an exhaust conduit and a sampling line coupled to the exhaust conduit. The sampling line includes an organic compound sensor and sampling flow control valve that are communicatively coupled to a control module.

Figure 1:
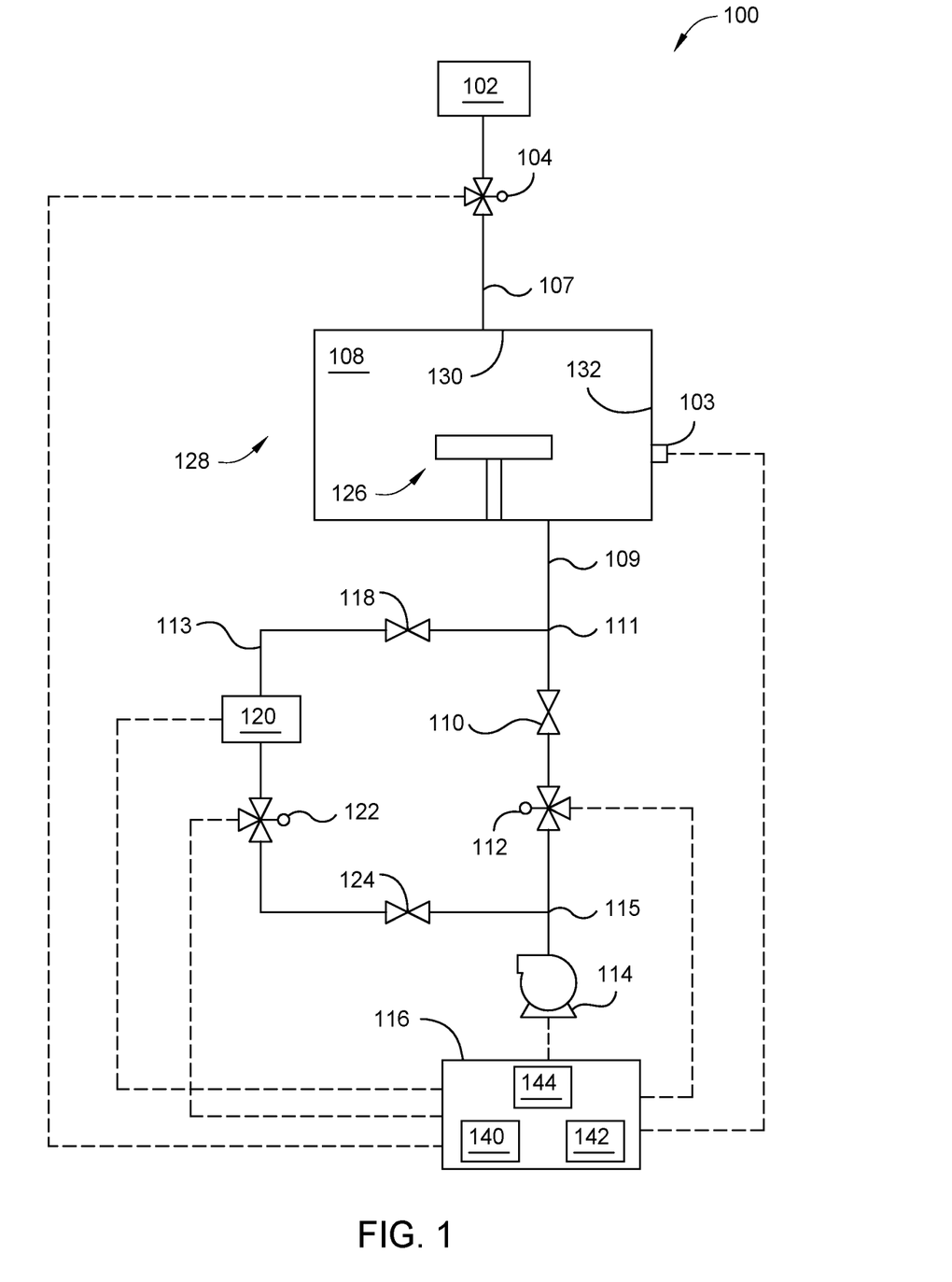
FIG. 1 schematically illustrates an example thermal processing apparatus having an organic compound sensor, in accordance with certain aspects of the present disclosure.

FIG. 1 schematically illustrates an example thermal processing apparatus 100, in accordance with certain aspects of the present disclosure. The thermal processing apparatus 100 includes a gas source 102, an exhaust pump 114, and an organic compound sensor 120. The thermal processing apparatus 100 includes a thermal processing chamber 128 (such as an anneal chamber) which defines a processing volume 108. The side walls 132 and ceiling 130 are formed from a material suitable to withstand elevated processing temperatures. In some embodiments, the thermal processing chamber 128 can be formed from stainless steel, aluminum, and/or another suitable metallic material.

The processing volume 108 is configured to perform thermal processing on a substrate disposed therein by heating the substrate to temperatures above about 400° C., such as from about 700° C. to about 1200° C., such as from about 850° C. to about 1100° C. A substrate support 126 is disposed inside the processing volume 108 and is configured to retain a substrate thereon during thermal processing by various methods, such as vacuum chucking or electrostatic chucking. A substrate can also be positioned and/or retained on the substrate support 126 by various other apparatus, such as rings or pins, and/or by other methods. The substrate support 126 can also include resistive heating apparatus, such as a coil, to facilitate heating of substrates disposed thereon. Other heating methods, such as electromagnetic energy from lamps, can be used in combination with, or alternatively to, the resistive heating apparatus to heat the substrate.

The gas line 107 is a conduit of any suitable shape and can be formed from a quartz material, a ceramic material, and/or a metallic material. Surfaces of the gas line 107 can also be coated with various materials to reduce or prevent damage to, etching of, or deposition on the gas line 107.

The gas source 102 delivers one or more process gases to the thermal processing chamber 128 via gas line 107. The gas source 102 deliver process gases such as argon, oxygen, nitrogen, helium, and fluorine containing gases, such as nitrogen trifluoride, or combinations thereof. The process gases can be delivered to the thermal processing chamber 128 individually or in combination and/or sequentially or concurrently. A gas control valve 104 is coupled to the gas line 107 to control gas flow from the gas source 102 to the thermal processing chamber 128 through the gas line 107. In some embodiments, two or more gas sources (e.g., 102) can be in fluid communication with the processing volume 108.

In operation, material is outgassed from the thermally processed substrates and the outgassed material can deposit and build up on surfaces of the thermal processing chamber 128 (e.g., side walls 132, ceiling 130), components, and/or form a residue on the substrate. To prevent the deposits from accumulating on the surfaces of the thermal processing chamber 128, components, and/or to remove the deposits, the thermal processing chamber 128 can be purged with gas from the gas source.

Materials outgassed from the thermally processed substrates and materials removed from the surfaces of the thermal processing chamber 128 via gas are exhausted from the processing volume 108 by an exhaust conduit 109 by an exhaust pump 114. The exhaust pump 114 can be a turbopump, and the exhaust pump can generate (or be configured to generate) a reduced pressure environment in the processing volume 108 and/or remove gases and other materials from the processing volume 108.

The substrates can include materials that produce volatile organic compounds when thermally processed. In some embodiments, the substrates can include films such as spin-on-carbon films, photo resist films, spin-on-dielectrics, spin-on hardmasks, and spin-on-antireflective coatings. The films can include casting solvents such as propylene glycol methyl ether acetate (PGMEA), propylene glycol methyl ether (PGME), methanol, ethanol, isopropanol, acetone, toluene, and combinations thereof. Spin-on-carbon films can be composed of different compositions which can produce compounds such as naphthalene and ethyl acetate when thermally processed.

The gases, optional plasma, volatile compounds, and other materials (collectively, "effluent") are removed from the processing volume 108 by controlling the effluent flow rate of the effluent of the processing volume by using an effluent flow control valve 112 coupled to the exhaust conduit 109. The effluent flow control valve 112 controls the effluent flow rate from the thermal processing chamber 128 by using an optional pressure sensor 103 coupled to the thermal processing chamber 128 and/or the exhaust conduit 109. A control module 116 monitors signals from the optional pressure sensor 103 and manipulate the effluent flow control valve 112 to manage the pressure of the thermal processing chamber 128 and the effluent flow rate out of the thermal processing chamber 128. The control module 116 includes a central processing unit (CPU) 144, a memory 140, and a support circuit 142 used to control operating parameters. The CPU 144 can be of any form of a general purpose computer processor that can be used in an industrial setting. Software routines are stored in the memory 140, such as a remote storage system, random access memory, read only memory, floppy, or hard drive disk, or other forms of digital storage. The support circuit 142 are coupled to the CPU 144 using any configuration and include cache, clock circuits, input/output systems, power supplies, and the like. Bi-directional communications between the control module 116 and the various components (e.g., controllers, sensors, and valves) of the thermal processing chamber 128 are handled through numerous signal cables, by wireless signals, or combination, collectively referred to as signal buses depicted as dashed lines in FIG. 1 (see also, FIG. 4 and FIG. 5).

The thermal processing apparatus 100 includes an exhaust isolation valve 110 coupled to the exhaust conduit. The exhaust isolation valve 110 can be in an open position when the thermal processing chamber 128 is being outgassed and can be in a closed position when the thermal processing chamber 128 is not being outgassed. The exhaust isolation valve 110 can be manually operated, or can be remotely operated such as through the control module 116. In some embodiments, the exhaust isolation valve 110 can be in an open position when the thermal processing chamber 128 is being purged and the exhaust isolation valve 110 can be in a closed position to increase pressure in the thermal processing chamber 128 when being filled with gas.

The thermal processing apparatus 100 can include a sampling line 113 that can be coupled to the exhaust conduit 109, the sampling line 113 can include an organic compound sensor 120 and a sampling flow control valve 122. The sampling line can have a first line end 111 coupled to a first position of the exhaust conduit 109 and a second line end 115 coupled to a second position of the exhaust conduit 109. The sampling line 113 can include a first sampling isolation valve 118 and a second sampling isolation valve 124. In some embodiments, the first and second sampling isolation valves 118, 124 can be three way valves. For example, the first sampling isolation valve 118 can be a three way valve coupled to the junction of the first line end 111 and the exhaust conduit 109 and the second sampling isolation valve 124 can be a three way valve coupled to the junction of the second line end 115 and the exhaust conduit 109. In some embodiments, the first and second sampling isolation valves 118, 124 can be two way valves coupled to the sample line 113. The organic compound sensor 120 and the sampling flow control valve 122 can be disposed along the sampling line 113 in a position between the two sampling isolation valves 118, 124. In operation, the sampling isolation valves 118, 124 can be in an open position during sampling and organic compound monitoring and can be in a closed position when organic compounds are not being monitored. The sampling isolation valves 118, 124 can be manually operated or can be remotely operated such as through the control module 116. In some embodiments, the exhaust isolation valve 110 can be in a closed position and the sampling isolation valves can be in an open position during sampling. For example, the sampling can occur at any stage of the annealing process, such as when the exhaust isolation valve 110 is in a closed and/or when the exhaust isolation valve 110 is in an open position. The organic compound sampling can be continuous during the entire processing of the substrate.

The sampling flow control valve 122 and the organic compound sensor 120 can be communicatively coupled to the control module 116. The control module 116 can monitor signals from the organic compound sensor 120 and manipulate the sampling flow control valve 122 to manage the effluent flow across the organic compound sensor 120. For example, the sampling flow control valve 122 can prevent saturation of the organic compound sensor by regulating the effluent flow rate in the sampling line 113 to the organic compound sensor 120. The organic compound sensor 120 can detect volatile organic compounds formed inside the thermal processing chamber 128. The organic compound sensor can be a sensor selected from a group consisting of a photoionization detector (PID), a residual gas analyzer (RGA), and a non-dispersive infrared sensor (NDIR). For example, the organic compound sensor can be a PID. For example, the lamp of the PID can have an eV of about 10.0 eV to about 10.6 eV, such as 10.0 eV or 10.5 eV. In some embodiments, the organic compounds present in the effluents that can be detected according to systems, processes, and methods described herein include acetone, arsine, butadiene, benzene, cumene, dimethoxymethane, ethyl mercaptan, hydrogen sulfide, mesityl oxide, methyl ethyl ketone, methyl mercaptan, nitric oxide, phosphine, styrene, toluene, vinyl chloride, naphthalene, ethyl acetate, and combinations thereof. In some embodiments, the organic compounds present in the effluents that can be detected according to systems, processes, and methods described herein have ionization potentials of from about 8.0 eV to about 10.5 eV, such as about 8.1 eV, or about 10.1 eV.

In some aspects of the present disclosure, the organic compound sensor is sized to easily integrate with the apparatus. In some embodiments, the organic compound sensor can have a height of from about 10 mm to about 50 mm, such as about 10 mm to about 20 mm, such as about 17.6 mm. In some embodiments, the organic compound sensor can have a diameter of from about 10 mm to about 50 mm, such as about 10 mm to about 30 mm, such as about 20.4 mm. In some embodiments, the organic compound sensor can have a weight of less than about 30 grams, such as less than about 20 grams, such as less than about 10 grams, such as less than about 8 grams, such as about 5 to about 9 grams, such as about 8 grams. A number of apparatus and methods are available for detecting the presence of organic compounds. These apparatus can be large and expensive and are not easily integrated in a system such as an annealing system. Integrating an organic compound sensor into a system can allow using the information to adjust operating parameters during processing. For example, without sensors, chambers (e.g. 128) are normally not evacuated and organic compounds accumulate in the chamber without detection. It is also possible that chambers are evacuated, but are not evacuated to sufficiently remove organic compounds. Evacuating a chamber without a sensor can insufficiently rely on evacuating the chamber at regular intervals without knowing how much organic compounds have accumulated in the chamber. If the chambers are evacuated too frequently, the overall process can be less efficient and losses can be incurred. However, if the chambers are not evacuated frequently enough, quality issues can result in the final substrate product which often goes unnoticed until the substrate product is produced and is found to have defects. Available detectors known to detect organic compounds can have the capability to measure intensity by mass and can identify the presence of specific species along with additional compositional details such as quantity of each species present. The inventors have discovered that these often large and expensive detectors are not necessary for the purposes of the systems provided in the present disclosure. In particular, a simple, small sensor that can detect an overall concentration of volatile organic compounds can provide adequate sensor data used to adjust operating parameters such as frequency of outgassing processing chambers. Moreover, the ability to manage organic compounds using sensors or detectors cannot be done using other compositional sensors that do not detect organic compounds such as oxygen sensors. For example, other compositional sensors that cannot detect organic compounds can be used in the chamber for other purposes such as monitoring the chamber for leaks, but are not useful for controlling operating parameters as disclosed herein.

Figure 2:
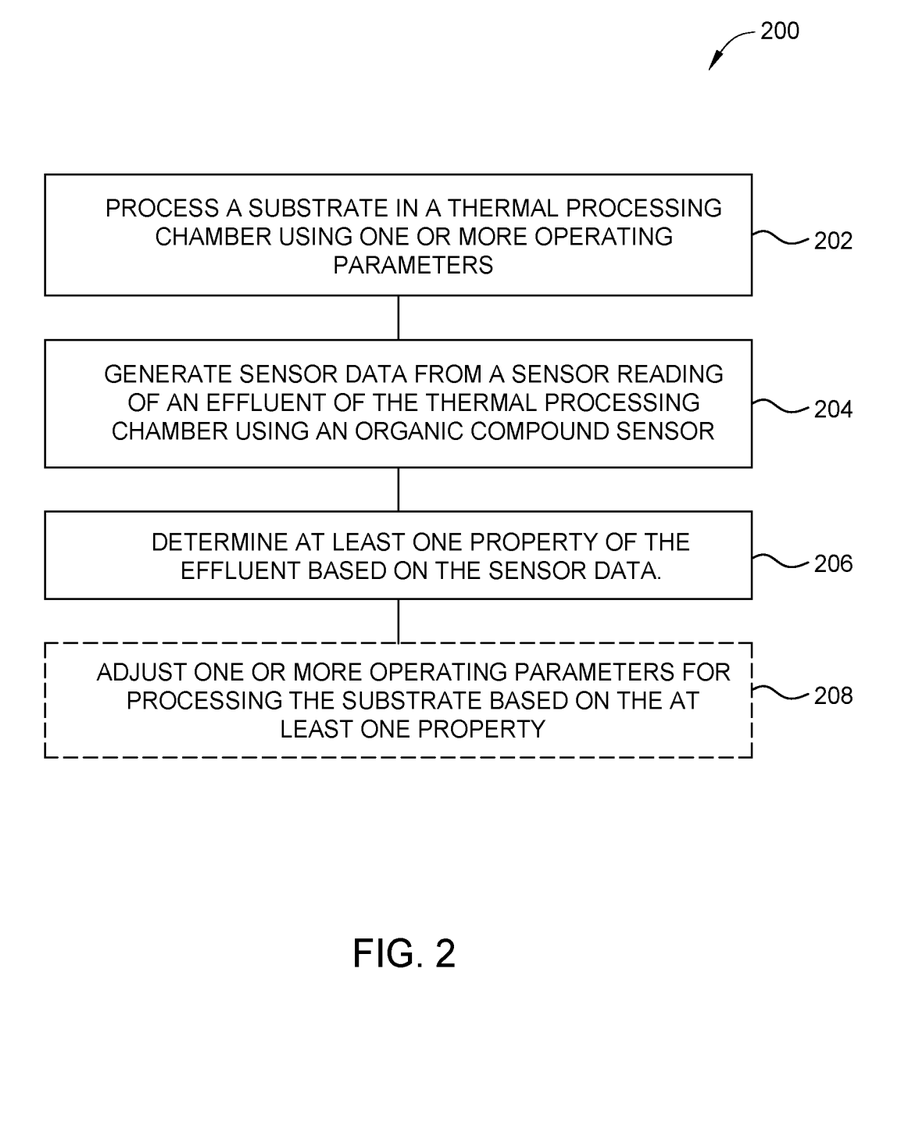
FIG. 2 is a block diagram of an example system for managing substrate outgassing, in accordance with certain aspects of the present disclosure.

FIG. 2 is a block flow diagram of an example system for managing substrate outgassing, in accordance with certain aspects of the present disclosure. The system can include various operations 200. These operations 200 can include one or more of: processing a substrate in a thermal processing chamber using operating parameters 202; generating sensor data from a sensor reading of an effluent of the thermal processing chamber using an organic compound sensor 204; determining at least one property of the effluent based on the sensor data 206; and/or (optionally) adjusting operating parameters for processing the substrate based on the at least one property 208.

Processing the substrate in the thermal processing chamber 128 can use operating parameters such as annealing time, annealing temperature, type of gas and optional plasma introduced to the processing volume 108, flow rate and amount of the gas and optional plasma introduced to the processing volume 108, effluent flow rate out of the thermal processing chamber 128, temperature of the thermal processing chamber 128, pressure of the thermal processing chamber 128, and/or time at each process condition. In some embodiments, the substrate can be annealed at a temperature of from about 175° C. to about 300° C. at from about 20 to about 530 torr, such as about 470 torr to about 530 torr. The anneal time can be from about 1 second to about 120 seconds, such as about 30 seconds to 90 seconds, such as about 60 seconds.

The sensor data can be generated from the organic compound sensor 120 and determine at least one property of the effluent such as presence of organic compounds or concentration of total organic compounds. The sensor data can be used to adjust operating parameters for processing the substrate based on the at least one property. For example, the operating parameters can include a chamber pressure of the thermal processing chamber, a time of processing the substrate in the thermal processing chamber, an exhaust gas flow rate, a gas type introduced to the thermal processing chamber, a substrate position in the thermal processing chamber, or combinations thereof. In one embodiment a process design can include different operating parameters for each operation of the process design. For example, the operation can be a pump operation and the pump operation can end after a time, or it can end when a sensor reading is at or near a property value such as a concentration of organic compounds.

Figure 3:
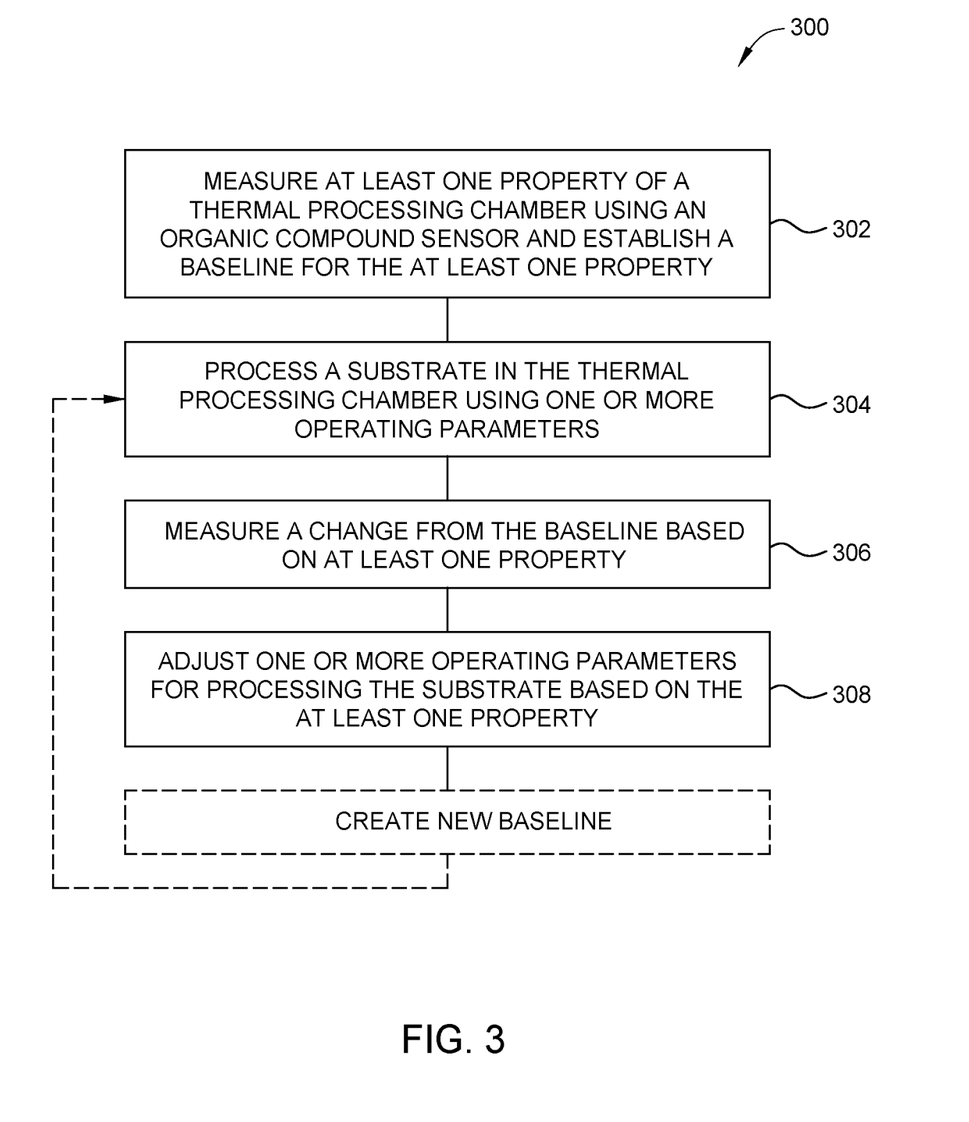
FIG. 3 is a block diagram of an example system for managing substrate outgassing by updating baseline sensor information, in accordance with certain aspects of the present disclosure.

FIG. 3 is a block flow diagram of example system for managing substrate outgassing by updating baseline sensor information, in accordance with certain aspects of the present disclosure. The system can include various operations 300. These operations 300 can include one or more of: measuring at least one property of a thermal processing chamber using an organic compound sensor and establishing a baseline for the at least one property 302; processing a substrate in the thermal processing chamber using operating parameters 304; measuring change from the baseline based on at least one property; adjusting operating parameters for processing the substrate based on the at least one property 306; and/or creating a new baseline 308. The operating parameters can include the operating parameters described in reference to FIG. 2.

In some aspects of the present disclosure, the organic compound sensor can measure at least one property such as the presence of organic compounds, or a concentration of total organic compounds, or a concentration of a particular organic compound, or a combination thereof in order to establish a baseline for the at least one property. In some embodiments, the baseline can include environmental influences on the sensor and the presence of background composition readings. Environmental influences can include humidity, sensor component quality, sensor light intensity over time, sensor saturation level, differences of organic compounds from substrate to substrate, or combinations thereof. In some embodiments, the baseline can be used to calibrate the sensor. Based on the type of sensor and substrate, it is also possible to calibrate the sensor based on an organic compound that is being detected. In some embodiments, calibration based on an organic compound is not necessary for the purposes of the present disclosure. Once a baseline is established, the substrate can be processed in the thermal processing chamber using operating parameters such as a chamber pressure of the thermal processing chamber, a time of processing the substrate in the thermal processing chamber, an effluent flow rate, a gas type introduced to the thermal processing chamber, a gas flow rate into the thermal processing chamber, and combinations thereof. Each of the operating parameters can be controlled by a control module that communicates with each individual controller. The control module 116 can also manipulate each operating parameter based on sensor data once a property such as organic compound concentration has reached a value, which may be a predetermined value. The value can be, e.g., a threshold value above the baseline.

In some embodiments, the thermal processing chamber can be pumped and purged after the value is reached. As used herein, the process of "pumping" a thermal processing chamber refers to evacuating the thermal processing volume by stopping the flow of gas from gas source 102 into the thermal processing volume 108, and pumping out the gas in the thermal processing volume 108 by opening the pressure control valve 112 to the exhaust pump 114. As used herein, the process of "purging" a thermal processing chamber is backfilling the thermal processing volume 108 by increasing the pressure to the thermal processing volume 108 and filling with a gas from a gas source 102, such as nitrogen gas. This process is referred to herein as "pump/purge". For example, after the process chamber is pumped and purged, sensor data can be collected again to establish a new baseline and the process can repeat, beginning at operation 302. Although not shown in FIG. 1, the thermal processing chamber 128 can be coupled to more than one gas source 102, and gas control valve 104. Thus, each of the different gas control valves (e.g. 104) can be manipulated by the control module 116 such that a different type of gas can enter the chamber based on the at least one property of the effluent based on the sensor data. The new baseline can account for drifts in the sensor data that can result from different causes such as sensor saturation. Under some processing conditions, operating parameters can be adjusted based on the difference in the sensor reading after a period following an adjustment, such as pumping and purging the chamber, rather than an absolute sensor reading at a given sampling time.

Figure 4:
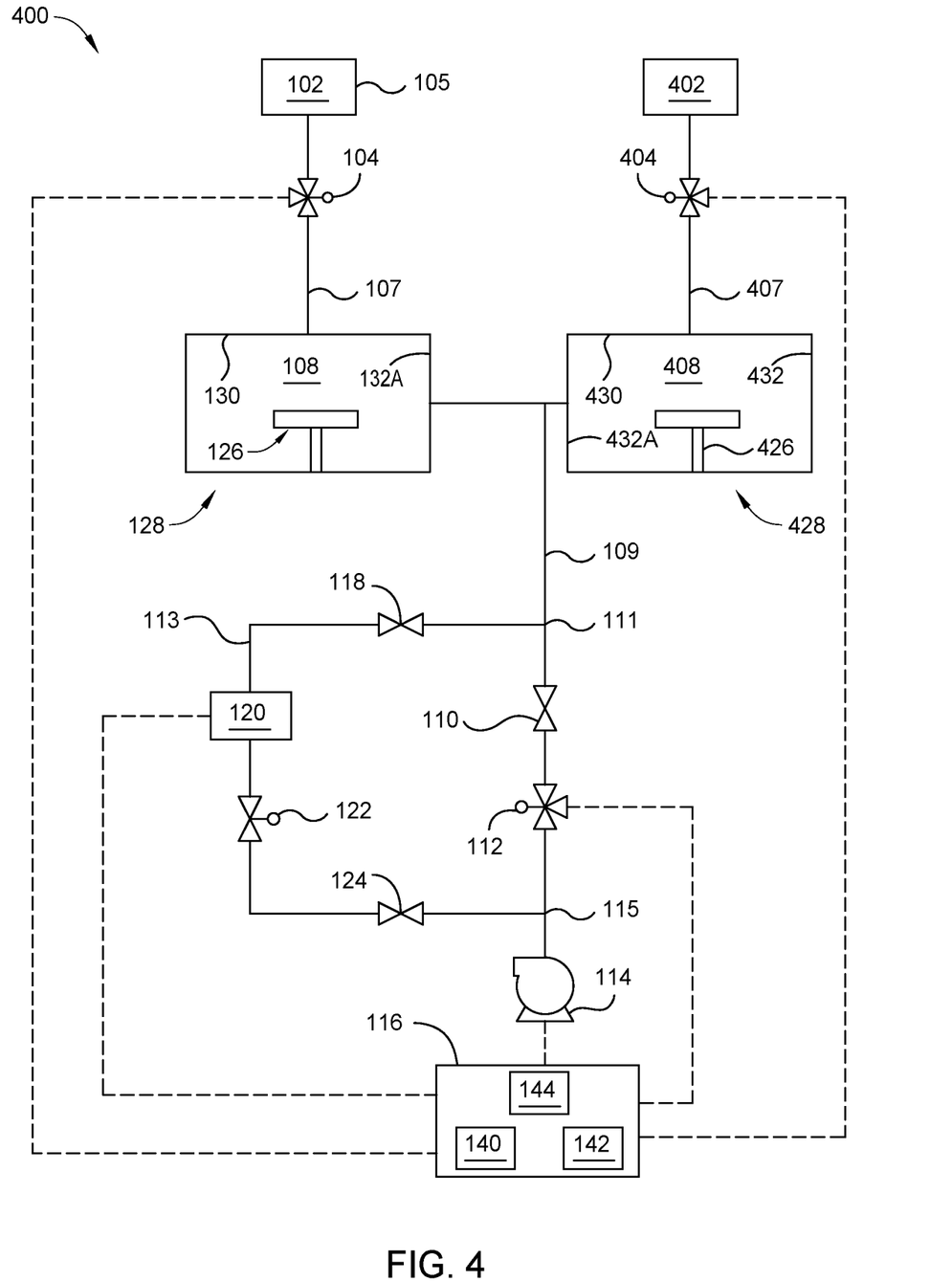
FIG. 4 schematically illustrates an example dual thermal processing apparatus having an organic compound sensor, in accordance with certain aspects of the present disclosure.

FIG. 4 schematically illustrates an example dual thermal processing apparatus having an organic compound sensor, in accordance with certain aspects of the present disclosure. The thermal processing apparatus 400 can include first thermal processing chamber 128 which is described with reference to FIG. 1 above and a second thermal processing chamber 428 which can be substantially identical to the first thermal processing chamber 128. The second thermal processing chamber 428 defines a second processing volume 408, has second sidewalls 432 and a second ceiling 430, and can have a second substrate support 426 disposed therein. The materials and configuration of the second thermal processing chamber 428 can be identical to or substantially similar to the materials and configuration of the first process chamber 128 as described in FIG. 1.

In at least one embodiment, the first thermal processing chamber 128 and the second thermal processing chamber 428 share a wall. In such an embodiment, the side wall 432A of the first thermal processing chamber 128 and the sidewall 132A of the second thermal processing chamber 428 are joined, or are the same wall.

A second gas source 402 can be coupled and in fluid communication with the second processing volume 408. The second gas source 402 can be configured to deliver gas to the second processing volume 408 via a second gas line 407 which is fluidly coupled to the second gas source 402 and the second processing volume 408. For example, the second gas line 407 can extend from the second gas line 402 to the second ceiling 430 of the second thermal processing chamber 428. The second gas line 407 can be a conduit of any suitable shape and can be formed from a material which is substantially unreactive to the gases delivered by the second gas source 402. For example, the second gas line 407 can be formed from a quartz material, a ceramic material, and/or a metallic material. In at least one embodiment, the first gas source 102 and the second gas source 402 are separate gas sources. In another embodiment, the first gas source 102 and the second gas source 402 are the same gas source. In either embodiment, the first and second gas sources 102, 402 may be configured to deliver any combination of precursor gases. In some embodiments, the second gas source 402 can deliver precursor gases such as argon, oxygen, nitrogen, helium, and fluorine containing gases, such as nitrogen trifluoride, or the like. The precursor gases can be delivered to the second thermal processing chamber individually or in combination and/or sequentially or concurrently. A second gas source controller 404 can be coupled to the second gas line 407 to control gas flow to the second thermal processing volume 408. In some embodiments, two or more gas sources (e.g. 402) can be coupled to the second processing volume 408.

The second processing volume 408 can also be connected to the exhaust pump 114 via exhaust conduit 109. The exhaust conduit 109 can be in fluid communication with both the first processing volume 108 and the second processing volume 408 as shown in FIG. 4.

Materials outgassed from the thermally processed substrates and materials removed from the surfaces of the second thermal processing chamber 428 can be exhausted from the second processing volume 408 by an exhaust conduit 109 to an exhaust pump 114 in substantially the same way materials are outgassed from the first thermal processing chamber 128 via the same exhaust conduit 109 or a different exhaust conduit (not shown). The exhaust pump 114 can be a turbopump, configured to generate a reduced pressure environment in the second processing volume 408 and to remove gases and other materials from the second processing volume 408. The substrates can include materials that produce volatile organic compounds when thermally processed. In some embodiments, the substrates can include films such as spin-on-carbon films, photo resist films, spin-on-dielectrics, spin-on hardmasks, and spin-on-antireflective coatings. The films can include casting solvents such as propylene glycol methyl ether acetate (PGMEA), propylene glycol methyl ether (PGME), methanol, ethanol, isopropanol, acetone, toluene, and combinations thereof. Spin-on-carbon films can be composed of different compositions which can produce compounds such as naphthalene and ethyl acetate when thermally processed.

The gases, optional plasma, volatile compounds, and other materials (collectively, "effluent") can be removed from the second processing volume 408 by controlling the effluent flow rate of the effluent of the processing volume by using an effluent flow control valve 112 coupled to the exhaust conduit 109. The effluent flow control valve 112 can control the effluent flow rate from the thermal processing chamber 128 by using an optional second pressure sensor (not shown) coupled to the exhaust conduit 109. A control module 116 can monitor signals from the pressure sensor and manipulate the chamber exhaust flow controller 112 to manage the pressure of the first and second thermal processing chambers 128, 428 and the effluent flow rate out of the first and second thermal processing chambers 128, 428. The thermal processing apparatus 400 can include an exhaust isolation valve 110 coupled to the exhaust conduit 109. The exhaust isolation valve 110 can be in an open position when the first and second thermal processing chambers 128, 428 are being outgassed and can be in a closed position when the first and second thermal processing chambers 128, 428 are not being outgassed. The exhaust isolation valve 110 can be manually operated or can be remotely operated such as through the control module 116. In some embodiments, the exhaust isolation valve 110 can be in an open position when the thermal processing chambers 128, 428 are being purged and the exhaust isolation valve 110 can be in a closed position to increase pressure in the thermal processing chamber 128, 428 when being filled with gas.

The thermal processing apparatus 400 can include a sampling line 113 that can be coupled to the exhaust conduit 109, the sampling line 113 can include an organic compound sensor 120 and a sampling flow control valve 122. The sampling line can have a first line end 111 coupled to a first position of the exhaust conduit 109 and a second line end 115 coupled to a second position of the exhaust conduit 109. The sampling line 113 can include a first sampling isolation valve 118 and a second sampling isolation valve 124. In some embodiments, the first and second sampling isolation valves 118, 124 can be three way valves. For example, the first sampling isolation valve 118 can be a three way valve coupled to the junction of the first line end 111 and the exhaust conduit 109 and the second sampling isolation valve 124 can be a three way valve coupled to the junction of the second line end 115 and the exhaust conduit 109. In some embodiments, the first and second sampling isolation valves 118, 124 can be two way valves coupled to the sample line 113. The organic compound sensor 120 and the sampling flow control valve 122 can be disposed along the sampling line 113 in a position between the two sampling isolation valves, such as a first and second sampling isolation valves 118, 124. In operation, the sampling isolation valves 118, 124 can be in an open position during sampling and organic compound monitoring and can be in a closed position when organic compounds are not being monitored. The sampling isolation valves 118, 124 can be manually operated or can be remotely operated such as through the control module 116. In some embodiments, the exhaust isolation valve 110 can be in a closed position and the sampling isolation valves can be in an open position during sampling. For example, the sampling can occur at any stage of the annealing process, such as when the exhaust isolation valve 110 is in a closed and/or when the exhaust isolation valve 110 is in an open position. In some embodiments, the sampling can be continuous during all stages of the annealing process.

The sampling flow control valve 122 and the organic compound sensor 120 can be communicatively coupled to the control module 116. The control module 116 can monitor signals from the organic compound sensor 120 and manipulate the sampling flow control valve 122 to manage the effluent flow across the organic compound sensor 120. For example, the sampling flow control valve 122 can prevent saturation of the organic compound sensor by regulating the effluent flow rate in the sampling line 113 to the organic compound sensor 120.

The organic compound sensor 120 can detect volatile organic compounds formed inside the thermal processing chamber 128. The organic compound sensor can be a sensor selected from a group consisting of a photoionization detector (PID), a residual gas analyzer (RGA), and a non-dispersive infrared sensor (NDIR). For example, the sensor can expose the organic compound in the processing volume to be detected by the sensor to electromagnetic energy, such as ultraviolet light, which ionizes the organic compound and reports a concentration. In at least one embodiment, the organic compound can have an ionization potential less than the eV of a lamp of the PID and can be detected by photoionization. For example, the lamp of the PID can have an eV of about 10.0 eV to about 10.6 eV, such as 10.0 eV or 10.5 eV. For example, the organic compound sensor can be a PID. In some embodiments, the organic compounds present in the effluents that can be detected according to systems, processes, and methods described herein include acetone, arsine, butadiene, benzene, cumene, dimethoxymethane, ethyl mercaptan, hydrogen sulfide, mesityl oxide, methyl ethyl ketone, methyl mercaptan, nitric oxide, phosphine, styrene, toluene, vinyl chloride, naphthalene, ethyl acetate, and combinations thereof. In some embodiments, the organic compounds present in the effluents that can be detected according to systems, processes, and methods described herein have ionization potentials of from about 8.0 eV to about 10.5 eV, such as about 8.1 eV, or about 10.1 eV.

FIG. 4 shows the two chambers sharing a single exhaust conduit 109 and a single sampling line 113. In some embodiments, the two chambers can have separate exhaust conduits and/or separate sampling lines which is depicted in FIG. 5 and described herein.

Figure 5:
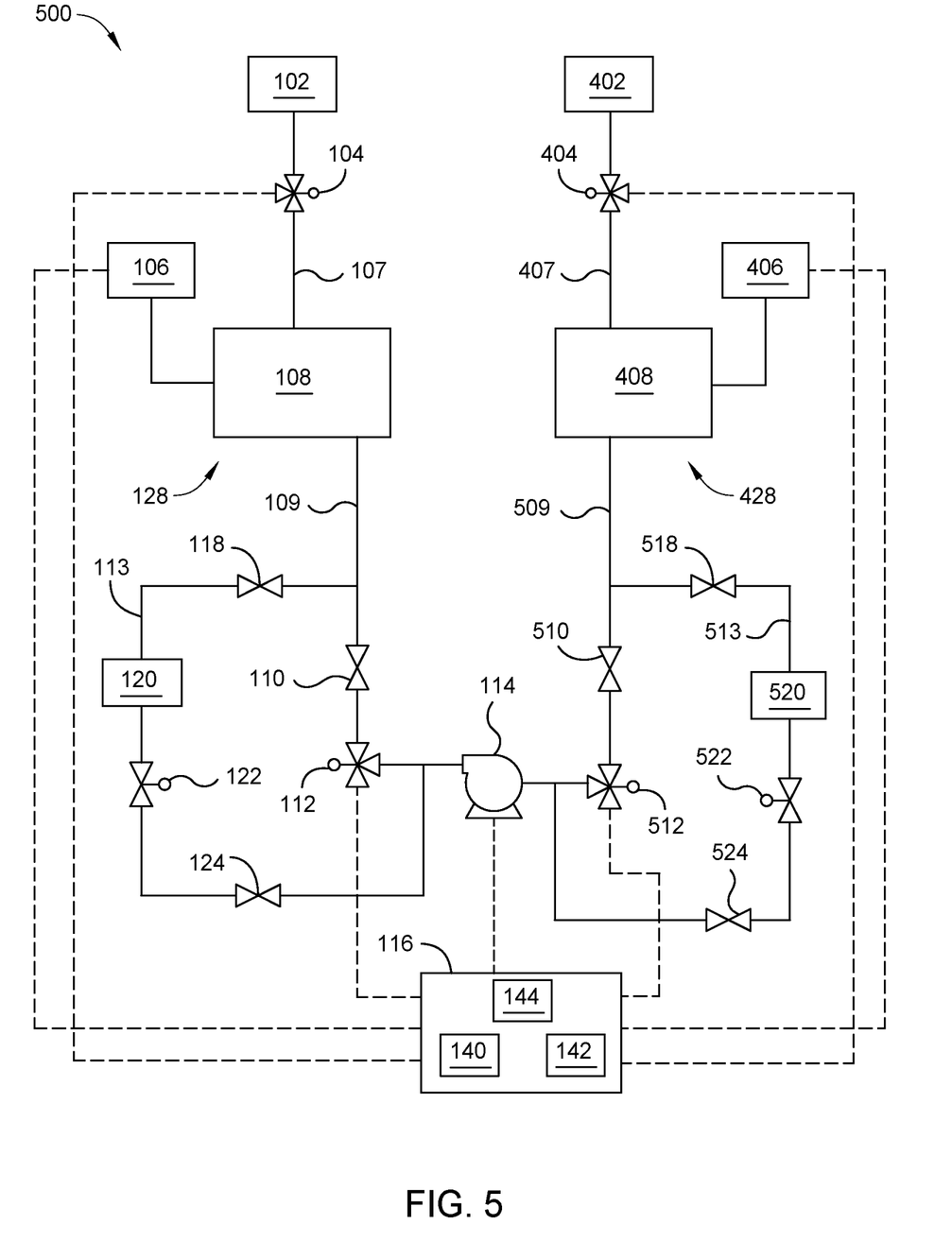
FIG. 5 schematically illustrates an example dual thermal processing apparatus having two organic compound sensors, in accordance with certain aspects of the present disclosure.

FIG. 5 schematically illustrates an example dual thermal processing apparatus 500 having two thermal processing chambers 128, 428 and two organic compound sensors 120, 520, in accordance with certain aspects of the present disclosure. The thermal processing chambers 128, 428 can be supplied with one or more shared, or distinct gas sources (e.g., 102, 402). In some embodiments the first thermal processing chamber 128 can have two gas sources, depicted by 106 and 102 in FIG. 5. In some embodiments the second thermal processing chamber 428 can have two gas sources, depicted by 406 and 402 in FIG. 5. In some embodiments, the annealing process includes the use of plasma. The two organic compound sensors 120, 520 can be controlled independently, for example, using control module 116. The first processing volume 108 can be connected to the exhaust pump 114 via first exhaust conduit 109. A first effluent flow control valve 112 and a first exhaust isolation valve 110 can be coupled to the first exhaust conduit 109. The second processing volume 408 can be connected to the exhaust pump 114 via second exhaust conduit 509. A second effluent flow control valve 512 and a second isolation valve 510 can be coupled to the second exhaust conduit 509. Each of the first and second effluent flow control valves 112, 512 can be communicatively coupled to the control module 116 such that each of the first and second thermal processing chambers 128, 428 can be controlled independently.

The thermal processing apparatus 500 can include a first sampling line 113 that can be coupled to the first exhaust conduit 109. The first sampling line 113 can include a first organic compound sensor 120, a first sampling flow control valve 122, and first pair of sampling isolation valves (e.g., 118, 124). The thermal processing apparatus 500 also includes a second sampling line 513 that can be coupled to the second exhaust conduit 509. The second sampling line 513 can include a second organic compound sensor 520, a second sampling flow control valve 522, and second pair of sampling isolation valves 518, 524. Each of the first and second organic compound sensors 120, 520 and sampling flow control valves 122, 522 can be communicatively coupled to the control module 116 such that each of the first and second thermal processing chambers 128, 428 can be controlled independently. Although not shown in the figures, each of the first and second thermal processing chambers 128, 428 can include one or more shared gas sources or one or more independent gas sources (e.g., 102, 402).

Example

A thermal processing apparatus as illustrated in FIG. 1 having a photoionization detector was arranged for annealing of silicon substrates with and without spin on carbon film. Several runs of exposing substrates were completed and tested for the presence of volatile organic compounds using an AMETEK MOCON piD-TECH® eVx photoionization sensor. Some of the runs were followed by a gas evacuation process ("pump/purge") prior to sampling for VOC, which was measured in parts per billion ("ppb").

In the first run, a first substrate with spin on carbon ("SoC substrate") was preheated at a temperature of 450° C. in the presence of helium gas, then annealed in the presence of nitrogen gas flowing into the chamber at 25 L/min at 530 T for 60 seconds. The sample isolation valves were in an open position and the sampling flow rate was controlled to 300 sccm and the PID detected a volatile organic compound level of about 6126 ppb. After the sampling, the isolation valves were closed. The first SoC substrate was removed from the anneal chamber and was followed by several runs with silicon substrates without spin on carbon film ("bare silicon substrate"). The bare silicon substrates were processed under the same conditions as the SoC substrate and chamber was sampled post sampling and detected a volatile organic compound (VOC) level generally below 469 ppb. The bare silicon substrate process immediately after the SoC run showed the highest VOC levels among the bare silicon substrates. Thermal processing of bare silicon substrates typically do not present outgassing concerns that are normally observed in other substrates such as SoC substrates.

After processing the bare silicon substrates, another SoC substrate was placed in the processing chamber and processed under the same conditions as the previous runs, except after processing, the chamber was evacuated by stopping the flow of gas into the chamber, and pumping out the gas in the processing chamber by opening the pressure control valve. The chamber was then backfilled by increasing the pressure to the chamber and filling with nitrogen at about 50 L/min. This process is referred to herein as "pump/purge". The resulting VOC reading was 667 ppb. The reading showed a substantial improvement over the first SoC substrate run (e.g. 6126 ppb) which processed the SoC substrate without the pump/purge process. The chamber was pumped and purged at the end of each run and the VOC readings were taken after pumping and purging of the chamber. In practice, the chamber can be pumped and purged after a predetermined VOC concentration is reached using continuous VOC monitoring in accordance to the methods of the present disclosure.

After processing the second SoC substrate, additional bare silicon substrates were processed with VOC readings all below 469 ppb. Finally, five SoC substrates were processed with the pump/purge process and produced results all below 667 ppb. The inventors have observed that a drift in VOC readings occurs and the drift data can be used to update target VOC readings during processing, for example, as illustrated in the example method depicted in FIG. 3. The capability to provide VOC readings between each substrate processing enabled evaluation of the effectiveness of the chamber evacuation process between substrate processing. Based on the information, the evacuation operation is further adjusted and operating parameters can be predetermined and/or adjusted in situ to prevent device defects. Moreover, the capability to monitor VOC readings during processing can assist with in situ process adjustments to prevent device defects.

According to at least one embodiment, one or more operations of the methods described above may be included as instructions in a computer-readable medium for execution by a control unit (e.g., controller module) or any other processing system. The computer-readable medium can include any suitable memory for storing instructions, such as random access memory (RAM), read only memory (ROM), floppy disk, hard disk, flash drive, or any other form of digital storage, local or remote.

While the foregoing is directed to embodiments of the present disclosure, other and further embodiments of the disclosure may be devised without departing from the basic scope thereof, and the scope thereof is determined by the claims that follow.

The invention claimed is:

1. A substrate processing apparatus, comprising:
   a thermal processing chamber defining a processing volume;
   a gas line coupled to the thermal processing chamber;
   an exhaust pump coupled to the thermal processing chamber by an exhaust conduit;
   an exhaust flow controller coupled to the exhaust conduit; and
   a sampling line coupled to the exhaust conduit, the sampling line comprising an organic compound sensor and a sampling flow control valve, the organic compound sensor being communicatively coupled to the exhaust flow controller.

2. The apparatus of claim 1, wherein the organic compound sensor is selected from the group consisting of a photoionization detector (PID), a residual gas analyzer (RGA), and a non-dispersive infrared sensor (NDIR).

3. The apparatus of claim 1, wherein the exhaust pump is a turbopump.

4. The apparatus of claim 1, the sampling line comprising a first line end coupled to a first position of the exhaust conduit and a second line end coupled to a second position of the exhaust conduit.

5. The apparatus of claim 4, the sampling line comprises,
   a first sampling isolation valve; and
   a second sampling isolation valve, wherein the organic compound sensor and the sampling flow control valve are disposed between the first sampling isolation valve and the second sampling isolation valve.

6. The apparatus of claim 4 further comprising an exhaust isolation valve coupled to the exhaust conduit, the exhaust isolation valve being disposed between the first position and the second position of the exhaust conduit.

7. The apparatus of claim 4, the exhaust flow controller being disposed between the first position and the second position of the exhaust conduit.

8. The apparatus of claim 1, further comprising a gas control valve coupled to the gas line, the gas control valve configured to control a gas flow from a gas source, wherein the gas control valve is communicatively coupled to the organic compound sensor.

9. The apparatus of claim 1, wherein the organic compound sensor detects gas produced inside the thermal processing chamber.

10. A method of processing a substrate comprising,
    processing a substrate in a thermal processing chamber using one or more operating parameters;
    generating sensor data from a sensor reading of an effluent of the thermal processing chamber using an organic compound sensor;
    determining at least one property of the effluent based on the sensor data; and
    adjusting the one or more operating parameters for processing the substrate based on the at least one property.

11. The method of claim 10 wherein adjusting the one or more operating parameters comprises pumping the thermal processing chamber and purging the thermal processing chamber.

12. The method of claim 10, wherein the one or more operating parameters comprises a chamber pressure of the thermal processing chamber, a time of processing the substrate in the thermal processing chamber, an exhaust gas flow rate, a gas type introduced to the thermal processing chamber, a gas flow rate into the thermal processing chamber, or combinations thereof.

13. The method of claim 10, wherein the at least one property comprises a concentration of an organic compound.

14. The method of claim 10, wherein processing a substrate comprises annealing the substrate.

15. A system programmed to perform a method, comprising:
    an algorithm stored in a memory of the system, wherein the algorithm comprises a number of instructions which, when executed by a processor, causes a method to be performed, comprising:
    processing a substrate in a thermal processing chamber using one or more operating parameters;
    generating sensor data from a sensor reading of an effluent of the thermal processing chamber using an organic compound sensor;
    determining at least one property of the effluent based on the sensor data; and
    adjusting the one or more operating parameters for processing the substrate based on the at least one property.

16. The system of claim 15, wherein the substrate comprises a spin on carbon film.

17. The system of claim 15, wherein the one or more operating parameters comprises a chamber pressure of the thermal processing chamber, a time of processing the substrate in the thermal processing chamber, a time interval between outgassing, an exhaust gas flow rate, a gas type introduced to the thermal processing chamber is adjusted based on the sensor data of the organic compound sensor, a gas flow rate into the thermal processing chamber, or combinations thereof.

18. The system of claim 15, wherein the at least one property comprises a concentration of an organic compound.

19. The system of claim 18, wherein the at least one property comprises a concentration of a volatile organic compound.

20. The system of claim 15, wherein processing the substrate comprises annealing the substrate.

* * * * *